United States Patent
Anikitchev

(10) Patent No.: US 10,353,208 B2
(45) Date of Patent: *Jul. 16, 2019

(54) HIGH-EFFICIENCY LINE-FORMING OPTICAL SYSTEMS AND METHODS USING A SERRATED SPATIAL FILTER

(71) Applicant: Ultratech, Inc., San Jose, CA (US)

(72) Inventor: Serguei Anikitchev, Hayward, CA (US)

(73) Assignee: Ultratech, Inc., San Jose, CA (US)

( * ) Notice: Subject to any disclaimer, the term of this patent is extended or adjusted under 35 U.S.C. 154(b) by 98 days.

This patent is subject to a terminal disclaimer.

(21) Appl. No.: 15/210,399

(22) Filed: Jul. 14, 2016

(65) Prior Publication Data

US 2017/0025287 A1    Jan. 26, 2017

Related U.S. Application Data

(60) Provisional application No. 62/195,349, filed on Jul. 22, 2015.

(51) Int. Cl.
  *G02B 27/09* (2006.01)
  *H01L 21/268* (2006.01)
  *G02B 19/00* (2006.01)

(52) U.S. Cl.
  CPC ..... *G02B 27/0983* (2013.01); *G02B 19/0004* (2013.01); *G02B 19/0047* (2013.01);
  (Continued)

(58) Field of Classification Search
  CPC ............ G02B 27/0988; G02B 27/0927; G02B 19/0004; G02B 19/0047; H01L 21/268
  See application file for complete search history.

(56) References Cited

U.S. PATENT DOCUMENTS 3,977,772 A  *  8/1976  Rimmer ................. G02B 27/58
                                                      359/739
4,832,446 A  *  5/1989  Miyagawa ........... G02B 26/127
                                                      359/559
(Continued)

FOREIGN PATENT DOCUMENTS

CA           1321496         8/1993
CN         102540473 A       7/2012
(Continued)

OTHER PUBLICATIONS

Written Opinion dated Aug. 2, 2018, Intellectual Property Office of Singapore, Singapore Patent Application No. 10201605683W.
(Continued)

*Primary Examiner* — Geoffrey S Evans
(74) *Attorney, Agent, or Firm* — Downs Rachlin Martin PLLC

(57) ABSTRACT

High-efficiency line-forming optical systems and methods that employ a serrated aperture are disclosed. The line-forming optical system includes a laser source, a beam conditioning optical system, a first aperture device, and a relay optical system that includes a second aperture device having the serrated aperture. The serrated aperture is defined by opposing serrated blades configured to reduce intensity variations in a line image formed at an image plane as compared to using an aperture having straight-edged blades.

20 Claims, 11 Drawing Sheets

(52) U.S. Cl.
CPC ..... *G02B 27/0927* (2013.01); *G02B 27/0988* (2013.01); *H01L 21/268* (2013.01)

(56) References Cited

U.S. PATENT DOCUMENTS

| | | | |
|---|---|---|---|
| 6,259,055 B1 * | 7/2001 | Sokol | B23K 26/06 219/121.68 |
| 6,320,648 B1 | 11/2001 | Brueck et al. | |
| 6,525,806 B1 | 2/2003 | Smith | |
| 7,539,371 B2 | 5/2009 | Martinelli et al. | |
| 7,847,213 B1 | 12/2010 | Anikitchev | |
| 8,014,427 B1 * | 9/2011 | Anikitchev | B23K 26/0643 372/9 |
| 9,411,163 B2 * | 8/2016 | Anikitchev | G02B 27/0927 |
| 9,613,815 B2 * | 4/2017 | Hawryluk | B23K 26/0626 |
| 2005/0103998 A1 | 5/2005 | Talwar et al. | |
| 2006/0163223 A1 | 7/2006 | Zhang et al. | |
| 2015/0079503 A1 * | 3/2015 | Xie | G03F 1/00 430/5 |
| 2016/0148810 A1 * | 5/2016 | Hawryluk | B23K 26/0626 438/798 |

FOREIGN PATENT DOCUMENTS

| | | |
|---|---|---|
| JP | S63-136018 | 6/1988 |
| JP | 2010109375 | 5/2010 |
| JP | 2012009824 | 1/2012 |
| JP | 2014013890 | 1/2014 |
| WO | 2001002907 A1 | 1/2001 |

OTHER PUBLICATIONS

S.K. Hong et al., "Improved Spatial Filter and Serrated Aperture for High-Energy Pulsed Lasers," Transactions of the Korean Nuclear Society Spring Meeting, May 25-26, 2006.

* cited by examiner

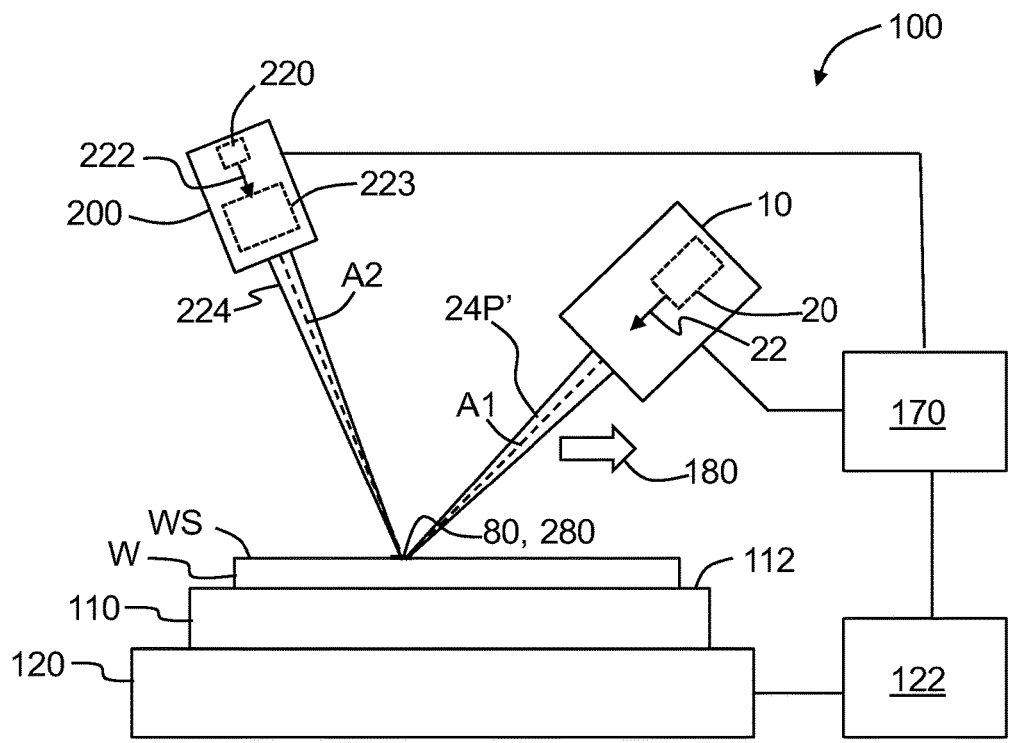
FIG. 9
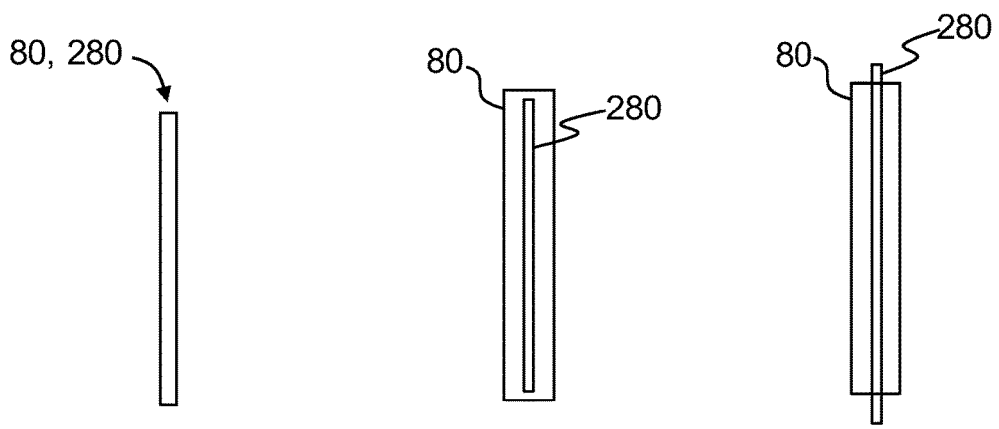
FIG. 10A  FIG. 10B  FIG. 10C

HIGH-EFFICIENCY LINE-FORMING OPTICAL SYSTEMS AND METHODS USING A SERRATED SPATIAL FILTER

CROSS-REFERENCE TO RELATED APPLICATIONS

This Application is related to U.S. Provisional Patent Application Ser. No. 62/030,391, entitled "High-efficiency line-forming optical systems and methods," filed on Jul. 29, 2014, and which is incorporated by reference herein, and is also related to U.S. Provisional Patent Application Ser. No. 62/083,537, "High-efficiency line-forming optical systems and methods for defect annealing and dopant activation", filed on Nov. 24, 2014, and which is also incorporated by reference herein. This Application also claims priority under 35 USC 119(e) from U.S. Provisional Patent Application No. 62/195,349, filed on Jul. 22, 2015, and which is incorporated by reference herein.

FIELD

The present disclosure relates to optical systems for forming a line image, and in particular relates to high-efficiency line-forming optical systems and methods for defect annealing and dopant activation.

The entire disclosure of any publication or patent document mentioned herein is incorporated by reference, including the following: U.S. Pat. No. 8,014,427; US 2012/0111838; US 2007/0072400; U.S. Pat. Nos. 7,148,159; 8,546,805; 8,865,603; 8,309,474; and U.S. patent application Ser. No. 14/497,006.

BACKGROUND

A variety of applications require the use of a uniform line image formed from a high-power laser beam. One such application is laser thermal processing (LTP), also referred to in the art as laser spike annealing (LSA) or just "laser annealing," which is used in semiconductor manufacturing to activate dopants in select regions of a semiconductor wafer when forming active microcircuit devices such as transistors.

One type of laser annealing uses a scanned line image formed from a laser beam to heat the surface of the semiconductor wafer to a temperature (the "annealing temperature") for a time long enough to activate the dopants but short enough to minimizing dopant diffusion. The time that the surface of semiconductor wafer is at the annealing temperature is determined by the power density of the line image, as well as by the line-image width divided by the velocity at which the line image is scanned (the "scan velocity").

One type of high-power laser that is used for laser annealing applications is $CO_2$ laser operating in a single spatial mode regime. Traditional methods of performing laser annealing with a $CO_2$ laser including illuminating a pair of knife-edges by collimated $CO_2$ laser beam and then relaying the light passing therethrough to an image plane to form the line image (imaging knife edges onto the semiconductor wafer).

FIG. 1 is a plot of the intensity profile I(x) and the thermal emission profile E(x) versus x (mm) as for a line image as measured at an image plane of a line-forming optical system. The x-direction is the long direction of the line image. The thermal emission profile E(x) is the measured thermal emission from a semiconductor wafer located at the image plane when irradiated with the line image having the intensity profile I(x). As can best be seen in the thermal emission profile E(x), intensity non-uniformities that show up as ripples in the intensity profile I(x) of line image cause non-uniformities in the heating of the semiconductor wafer. The intensity non-uniformities in the intensity profile I(x) are due to diffraction effects caused by the limited apertures of mirrors in the line-forming optical system.

What is needed is a way to smooth out the intensity ripples without substantially impacting the overall amount of intensity delivered to the image plane.

SUMMARY

High-efficiency line-forming optical systems and methods that employ a serrated aperture in a Fourier plane are disclosed. The line-forming optical system includes a laser source, a beam conditioning optical system, a first aperture device, and a relay optical system that includes the Fourier plane and a second aperture device in the Fourier plane having the serrated aperture. The serrated aperture is defined by serrated blades configured to reduce intensity variations in a line image formed at an image plane as compared to using an aperture having straight-edged blades.

An aspect of the disclosure is a method of performing defect annealing at a defect anneal temperature $T_D$ of a semiconductor wafer having a surface that includes a pattern. The method includes: forming from a $CO_2$ laser a light beam having a wavelength λ of nominally 10.6 microns and a first intensity profile with a Gaussian distribution in at least a first direction; passing at least 50% of the light beam in the first direction to form a first transmitted light; focusing the first transmitted light at a Fourier plane to define a second intensity profile having a central peak and first side peaks immediately adjacent the central peak; truncating the second intensity profile within each of the first side peaks with a serrated aperture disposed at the Fourier plane to define a second transmitted light that forms on the surface of semiconductor wafer a first line image having between 1000 W and 3000 W of optical power and an intensity uniformity of within +/−5% over a first line length in the range from 5 mm to 100 mm; and scanning the first line image over the surface of semiconductor wafer to locally raise a temperature of the surface of semiconductor wafer to the defect anneal temperature $T_D$.

Another aspect of the disclosure is the method described above, wherein the focusing of the first transmitted light is performed with a relay optical system having an optical component with a focal length f that defines the Fourier plane, wherein the serrated aperture has a width d2, and wherein the serrated aperture includes serrations having a length l in the range $0.1 \cdot (\lambda/(d2)) \cdot f \leq l \leq (\lambda/(d2)) \cdot f$.

Another aspect of the disclosure is the method described above, wherein the serrations have a pitch p within the range $(0.9) \cdot l \leq p \leq (1.1) \cdot l$.

Another aspect of the disclosure is the method described above, wherein the defect anneal temperature $T_D$ is in the range 650° C.$\leq T_D \leq$1100° C.

Another aspect of the disclosure is the method described above, and further including performing spike annealing at a spike anneal temperature by: forming a second line image at the surface of semiconductor wafer using a second light beam having a second wavelength, wherein the second line image at least partially overlaps the first line image; and scanning the second line image to locally raise the temperature of the surface of semiconductor wafer from the defect anneal temperature $T_D$ to the spike anneal temperature $T_A$.

Another aspect of the disclosure is the method described above, wherein the spike anneal temperature $T_A$ is in the range $1100°$ C.$\le T_A \le 1350°$ C.

Another aspect of the disclosure is the method described above, wherein the first line image has a first width and the second line image has a second width that is between 5% and 25% of the first width.

Another aspect of the disclosure is the method described above, wherein the first width is in the range from 50 microns to 5 mm.

Another aspect of the disclosure is the method described above, and further including forming the second light beam using a laser diode light source and line-forming optics operably arranged relative thereto.

Another aspect of the disclosure is the method described above, wherein the second wavelength is between 500 nm and 1000 nm.

Another aspect of the disclosure is the method described above, wherein the second line image has a second line length in the range between 5 mm and 100 mm and an intensity uniformity of within +/−5%.

Another aspect of the disclosure is the method described above, wherein the temperature of surface of semiconductor wafer has a variation from the spike anneal temperature $T_A$ due to pattern effects, and wherein the variation is no more than $60°$ C.

Another aspect of the disclosure is a system for performing defect annealing of a semiconductor wafer having a surface with a pattern. The system includes: a $CO_2$ laser source that emits an initial light beam having a wavelength $\lambda$ of nominally 10.6 microns; a beam-conditioning optical system that receives the initial light beam and forms therefrom a conditioned light beam having a first intensity profile with a Gaussian distribution in at least a first direction; a first aperture device operably disposed at an object plane and that defines a first slit aperture that truncates the first intensity profile in the first direction to define a first transmitted light that constitutes at least 50% of the conditioned light beam; a relay optical system that defines the object plane and that also defines an intermediate Fourier plane at which is operably disposed a second aperture device, the relay optical system defining at the intermediate Fourier plane a second intensity profile having a central peak and first side peaks immediately adjacent the central peak, wherein the second aperture device is configured with serrated blades that truncate the second intensity profile in the first direction and within each of the first side peaks to define a second transmitted light; wherein the relay optical system forms from the second transmitted light a first line image at the surface of semiconductor wafer, wherein the first line image includes between 1000 W and 3000 W of optical power, has a first length in the range from 5 mm to 100 mm, and has an intensity uniformity of within +/−5%; a chuck that operably supports the semiconductor wafer; and a moveable wafer stage that operably supports the chuck and that is configured to move the chuck and the semiconductor wafer supported thereon so that the first line image scans over the surface of semiconductor wafer to locally raise a temperature of the surface of semiconductor wafer to a defect anneal temperature $T_D$.

Another aspect of the disclosure is the system described above, wherein the relay optical system has a first optical component with a focal length f that defines the intermediate Fourier plane, wherein the serrated blades are separated by a width d2, and wherein the serrated blades each includes serrations having a length l in the range $0.1 \cdot (\lambda/(d2)) \cdot f \le l \le (\lambda/(d2)) \cdot f$.

Another aspect of the disclosure is the system described above, wherein the serrations have a pitch p within the range $(0.9) \cdot l \le p \le (1.1) \cdot l$.

Another aspect of the disclosure is the system described above, wherein the defect anneal temperature $T_D$ is in the range from $650°$ C. to $1100°$ C.

Another aspect of the disclosure is the system described above, wherein the chuck is heated so that it can pre-heat the semiconductor wafer.

Another aspect of the disclosure is the system described above, and further including a diode-based line-forming optical system that generates a visible light beam that forms at the surface of semiconductor wafer a second line image that at least partially overlaps and scans with the first line image to locally raise the temperature of the surface of semiconductor wafer from the defect annealing temperature $T_D$ to a spike anneal temperature $T_A$, and wherein the second line image has an intensity variation of within +/−5%.

Another aspect of the disclosure is the system described above, wherein the spike anneal temperature is in the range from $1150°$ C. to $1350°$ C.

Another aspect of the disclosure is the system described above, wherein the first and second line images have respective first and second widths, and wherein the second width is in the range from 5% to 25% of the first width.

Another aspect of the disclosure is the system described above, wherein each of the side peaks is defined by a maximum value MX and first and second minimum values m1 and m2, and wherein the second aperture device is configured to truncate the second intensity profile between the maximum value MX and the second minimum value m2 in each of the first side peaks.

Another aspect of the disclosure is the system described above, wherein the relay optical system has substantially 1× magnification in the first direction.

Another aspect of the disclosure is the system described above, wherein the relay optical system is a cylindrical optical system having optical power only in the first direction.

Another aspect of the disclosure is the system described above, wherein the relay optical system consists of reflective optical components only.

Another aspect of the disclosure is the system described above, wherein the first aperture device includes a pair of blades operably disposed in the object plane.

Another aspect of the disclosure is the system described above, wherein the second aperture device includes a pair of blades operably disposed in the intermediate Fourier plane.

Another aspect of the disclosure is the system described above, wherein the diode-based line-forming optical system includes a laser diode light source and line-forming optics arranged relative thereto.

Another aspect of the disclosure is a line-forming optical system for forming a line image at an image plane. The system includes: a laser source that emits an initial light beam having a wavelength $\lambda$; a beam-conditioning optical system that receives the initial light beam and forms therefrom a conditioned light beam having a first intensity profile with a Gaussian distribution in at least a first direction; a slit aperture that truncates the first intensity profile in the first direction to define a first transmitted light that constitutes at least 50% of the conditioned light beam; a relay optical system that includes first and second optical components and that defines an object plane, an image plane and a Fourier plane between the object and image planes, wherein the first optical component has a focal length f and forms at the Fourier plane a second intensity profile having a central peak and first side peaks immediately adjacent the central peak; opposing serrated blades arranged at the Fourier plane and configured to truncate the second intensity profile in the first direction and within each of the first side peaks to define a second transmitted light; and wherein the second optical component forms from the second transmitted light the line image at the image plane.

Another aspect of the disclosure is the line-forming optical system described above, wherein the laser source includes a $CO_2$ laser and wherein the initial light beam has a wavelength of nominally 10.6 microns.

Another aspect of the disclosure is the line-forming optical system described above, wherein the opposing serrated blades are separated by a width d2, and wherein the opposing serrated blades each includes serrations having a length l in the range $0.1 \cdot (\lambda/(d2)) \cdot f \leq l \leq (\lambda/(d2)) \cdot f$.

Another aspect of the disclosure is the line-forming optical system described above, wherein the serrations have a pitch p within the range $(0.9) \cdot l \leq p \leq (1.1) \cdot l$.

Another aspect of the disclosure is the line-forming optical system described above, wherein the line image has between 1000 W and 3000 W of optical power, has a length in the range from 5 mm to 100 mm, and has an intensity uniformity of within +/−5%.

Additional features and advantages are set forth in the Detailed Description that follows, and in part will be readily apparent to those skilled in the art from the description or recognized by practicing the embodiments as described in the written description and claims hereof, as well as the appended drawings. It is to be understood that both the foregoing general description and the following Detailed Description are merely exemplary, and are intended to provide an overview or framework to understand the nature and character of the claims.

BRIEF DESCRIPTION OF THE DRAWINGS

The accompanying drawings are included to provide a further understanding, and are incorporated in and constitute a part of this specification. The drawings illustrate one or more embodiment(s), and together with the Detailed Description serve to explain principles and operation of the various embodiments. As such, the disclosure will become more fully understood from the following Detailed Description, taken in conjunction with the accompanying Figures, in which:

FIG. 9 is similar to FIG. 8 and illustrates an example of a laser annealing system that can be used to perform defect annealing and spike annealing; and FIGS. 10A through 10C are close-up views of the line images formed by the $CO_2$-based line-forming optical system and the diode-based line-forming optical system, illustrating different examples of the relative positions of the two line images at the surface of semiconductor wafer.

DETAILED DESCRIPTION

Reference is now made in detail to various embodiments of the disclosure, examples of which are illustrated in the accompanying drawings. Whenever possible, the same or like reference numbers and symbols are used throughout the drawings to refer to the same or like parts. The drawings are not necessarily to scale, and one skilled in the art will recognize where the drawings have been simplified to illustrate the key aspects of the disclosure.

The claims as set forth below are incorporated into and constitute part of this Detailed Description.

Cartesian coordinates are shown in some of the Figures for the sake of reference and are not intended to be limiting as to direction or orientation. Further, the Cartesian coordinates at a second aperture device are denoted x' and y' to distinguish from the (x,y) coordinates at a first aperture device and at an image plane.

In the discussion below, the terms "laser beam" and "light" are used interchangeably. Also, the term "micron" and the symbol "μm" are used interchangeably.

The terms "upstream" and "downstream" are used to refer to the location of an item relative to direction of light travel as conventionally used in the art of optical system design, wherein when item B is said to be downstream of item A, light travels in the direction from item A to item B, and vice versa.

Line-Forming Optical System

Figure 2:
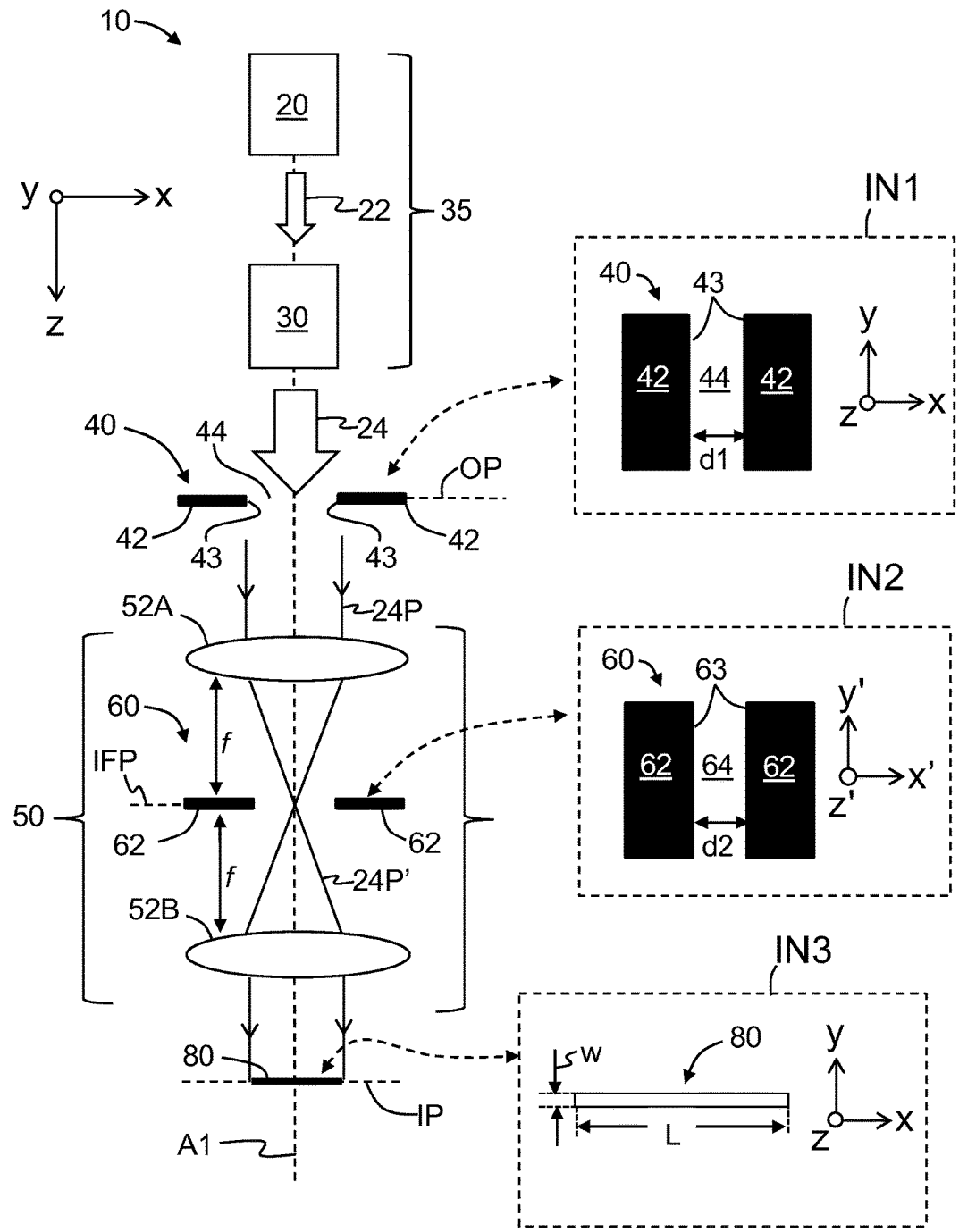
FIG. 2 is a schematic diagram of an example line-forming optical system according to the disclosure.

FIG. 2 is a schematic diagram of an example line-forming optical system 10 according to the disclosure. The line-forming optical system 10 includes an optical axis A1, an object plane OP and an image plane IP at which a line image 80 is formed as described below.

The line-forming optical system 10 includes along an optical axis A1 and upstream from the object plane OP a laser source 20 that emits an initial laser (light) beam 22 along the optical axis A1 towards the object plane OP. In an example, the laser source 20 includes a $CO_2$ laser that operates at a nominal wavelength of 10.6 μm. In an example, the initial laser beam 22 has a Gaussian distribution (profile) along at least the x-direction, and further in an example in both the x-direction and the y-direction. In an example, the initial laser beam 22 need not be circularly symmetric, e.g., the Gaussian profiles in the x-direction and y-direction can have different sizes. In an example, the laser source 20 outputs about 3500 W of optical power in the initial laser beam 22.

The line-forming optical system 10 also includes a beam-conditioning optical system 30 arranged along the optical axis A1 between the laser source 20 and the object plane OP. The beam-conditioning optical system 30 is configured to receive the initial laser beam 22 and form therefrom a conditioned laser (light) beam 24. In an example, the beam-conditioning optical system 30 is configured to perform beam expansion so that the conditioned laser beam 24 is an expanded version of the initial laser beam 22. In an example, the beam-conditioning optical system 30 is configured to provide the conditioned laser beam 24 with a select dimensions (profiles) in the x-direction and the y-direction. In an example, the beam-conditioning optical system 30 expands the dimensions of initial laser beam 22 by the same amount in the x-direction and the y-direction.

The beam-conditioning optical system 30 can include at least one of mirrors, lenses, apertures, and like optical components. An example beam-conditioning optical system 30 utilizes two or more off-axis mirrors each having optical power such as known in the art and two examples of which are described in U.S. Pat. Nos. 2,970,518 and 3,674,334. In various examples, the beam-conditioning optical system 30 can be anamorphic, cylindrical or circularly symmetric.

In an example embodiment, the laser source 20 and beam-conditioning optical system 30 define a laser source system 35 that generates the desired intensity profile $I(x,y)$ for the conditioned laser beam 24 for forming the line image 80. In an example where the laser source 20 emits a suitable initial laser beam 22 that does not need to be conditioned, then the beam-conditioning optical system 30 is not required and the initial laser beam 22 can be used in place of a conditioned laser beam 24. Thus, in the discussion below, the conditioned laser beam 24 is understood in an example to be defined by an unprocessed initial laser beam 22.

The line-forming optical system 10 also includes along the optical axis A1 and at the object plane OP a first aperture device 40. In an example, the first aperture device 40 includes a pair of blades 42 each having an edge 43. The blades 42 are disposed in the object plane OP on respective sides of the optical axis A1 so that their respective edges 43 are opposing and spaced apart to form a slit aperture 44. The slit aperture 44 has its long dimension in the Y-direction, as best seen in the close-up inset IN1, which shows the first aperture device 40 as it appears looking down the optical axis A1 in the +z direction. The slit aperture 44 has a width d1 in the x-direction that defines a length L of the line image 80 formed by the line-forming optical system 10 at the image plane IP, as described below. In an example, the blades 42 are movable to adjust the width d1 and thus the length L of line image 80.

The line-forming optical system 10 also includes the optical axis A1 and downstream of the first aperture device 40 a relay optical system 50. The relay optical system 50 shown in FIG. 2 is shown as a transmission optical system for ease of illustration. An example of a reflective relay optical system 50 is described below in connection with FIG. 6. The relay optical system 50 includes first and second optical components 52A and 52B. Within the relay optical system 50 is an intermediate Fourier plane IFP where a Fourier filter can be placed. Here, the term "intermediate" is used to mean that the Fourier plane IFP resides between the first and second optical components 52A and 52B. In the discussion below, the "intermediate Fourier plane" is simply referred to as the "Fourier plane."

In example, each optical component 52A and 52B can consist of one or more optical elements, such as lenses, mirrors, etc. The relay optical system 50 defines the object plane OP at the first aperture device 40 resides and also defines the image plane IP at which the line image 80 is formed. The Fourier plane IFP is a distance f away from the first optical component 52A and in the example shown is also a distance f away from the second optical component 52B, where the distance f is the focal length of first optical component 52A (and also of second optical component 52B). Thus, the first optical component 52A defines the Fourier plane IFP.

The relay optical system 50 further includes a second aperture device 60 arranged between the first and second optical components 52A and 52B at the Fourier plane IFP defined by the first optical component 52A. With reference to the second close-up inset IN2, in one example, the second aperture device 60 includes a pair of blades 62 each having an edge 63. The blades 62 are disposed in the Fourier plane IFP on respective sides of the optical axis A1 so that their respective edges 63 are opposing and spaced apart to form a slit aperture 64. The slit aperture 64 has its long dimension in the y'-direction, i.e., in the same direction as the slit aperture 44 of the first aperture device 40. The slit aperture 64 has a width d2 in the x'-direction. In an example, the blades 62 are movable to adjust the width d2.

Also in an example embodiment, the edges 63 of blades 62 can have serrations. This example embodiment is discussed in greater detail below.

In an example embodiment, the relay optical system 50 has substantially unit magnification (i.e., is substantially a 1× system) in the x-z plane. Also in examples, the relay optical system 50 can be either cylindrical or anamorphic. The width d1 of slit aperture 44 of first aperture device 40 defines the size of conditioned laser beam 24 in the x-direction, and for 1× magnification in the x-z plane, d1=L (see close-up inset IN3).

Figure 3A:
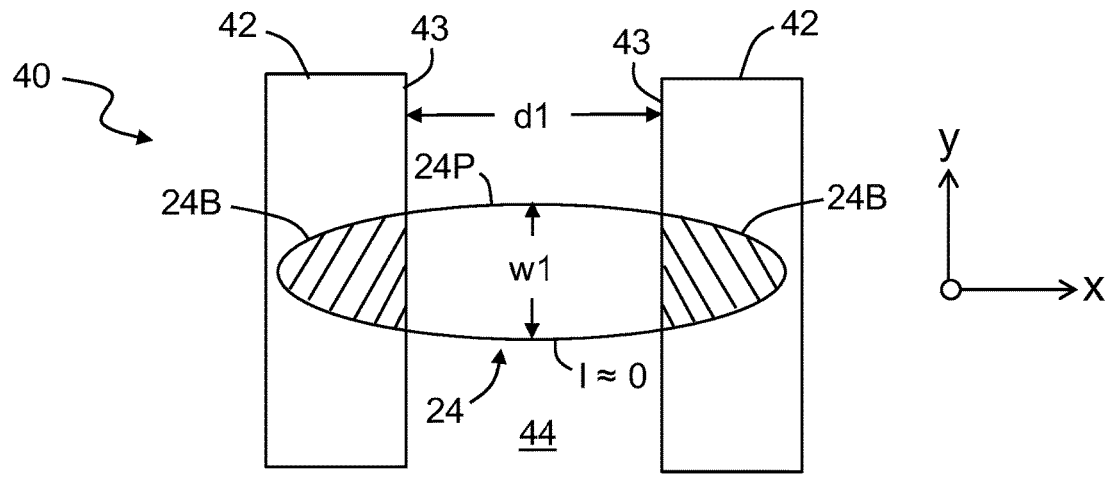
FIG. 3A is a front-on view of the first aperture device of the example line-forming optical system of FIG. 2 as seen looking in the +z direction and shows the approximate zero-intensity contour (I(x,y)≈0) of the conditioned laser beam as it is incident up the first aperture device.

In the general operation of line-forming optical system 10, the conditioned laser beam 24 is formed and the first aperture device 40 is configured so that a relatively large amount of the light in this conditioned laser beam 24 passes through the slit aperture 44. FIG. 3A is a front-on view of the first aperture device 40 (looking in the +z direction) and shows the approximate zero-intensity contour (I(x,y)≈0) of conditioned laser beam 24. In an example, the conditioned laser beam 24 has a Gaussian profile in the x-direction and y-direction, with the profile being longer in the x-direction (i.e., the intensity profile I(x,y) is elongate in the x-direction).

As noted above, the width w1 of the Gaussian profile in the y-direction defines the width (short dimension) of line image 80. In an example, the width w1 is defined by the beam-conditioning optical system 30, with the relay optical system 50 having no optical power in the y-z plane (i.e., the relay optical system 50 is cylindrical with optical power in the x-z plane only). This is one advantage of using a beam-conditioning optical system 30, since it avoids having to form the first and second optical components 52A and 52B using anamorphic elements.

Figure 3B:
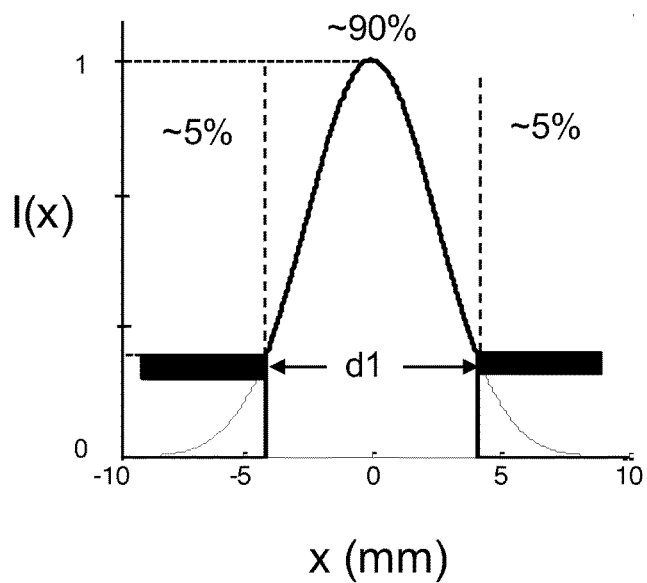
FIG. 3B is a plot of the intensity profile I(x) versus x (mm) of the conditioned laser beam and shows the location of the opposing blades of a first aperture device relative to the conditioned laser beam.

FIG. 3B is a plot of the intensity profile I(x) versus x (mm) of conditioned laser beam 24 that also shows an example location of the blades 42 of first aperture device 40 relative to the conditioned laser beam 24. The hashed portions 24B of conditioned laser beam 24 in FIG. 3A shows the portions of the conditioned laser beam 24 that are block by the respective blades 42, while the portion that passes through the slit aperture 44 is denoted 24P, which is also referred to below as "first transmitted light." This is also illustrated in FIG. 3B, wherein the dashed-line portion of the intensity profile I(x) shows the portion of the conditioned laser beam 24 that is blocked by the respective blades 42. In the example illustrated in FIGS. 3A and 3B, about 90% of the light in conditioned laser beam 24 passes through the slit aperture 44 as the first transmitted light 24P, while about 10% of the light of conditioned laser beam 24 at the wings of the intensity profile I(x) is blocked by the blades 42. In an example, the first aperture device 40 is configured to pass at least 50% of the conditioned laser beam 24.

Because the first aperture device 40 is configured to pass a substantial portion of the conditioned laser beam 24, the variation in intensity profile I(x) within the slit aperture 44 is relative large. In an example, this variation greater than 50% while in another example is greater than 65% while in another example is greater than 70%. This can be seen most clearly in FIG. 3B, wherein the (normalized) peak intensity is 1 in the center of slit aperture 44 (i.e., at x=0) while the intensity drops off to about 0.28, i.e., to about 28% of the maximum value of I(x) at the edges of first slit aperture 40 as defined by the edges 43. If this intensity profile is relayed to the image plane IP using convention relay means, the line image 80 will have a corresponding variation in intensity uniformity (about 72%) in the long direction. This is far greater than the preferred intensity uniformity of within +/−5% or in some cases within +/−2%, over the length L of line image 80.

With reference again to FIG. 2, the first transmitted light 24P that passes through the slit aperture 44 is focused onto the second aperture device 60 at the Fourier plane IFP by the first optical component 52A of relay optical system 50. The Fourier plane IFP has coordinates x' and y' to distinguish from the (x,y) coordinates at the first aperture device 40. This focusing gives rise to a second intensity profile I'(x',y'), which is defined by the 1-dimensional Fourier transform (in the x'-direction) of the intensity profile I(x,y) at the object plane OP.

In a simplified approach, where the serrations present in the edges 43 are disregarded, the intensity profile I(x) at the object plane OP can be defined as (with (d1)/2=a):

$$I(x) = G(x) \cdot \text{rect}(x/a)$$

where rect (x/a) is: 0 for |x|>a; ½ for x=a; and 1 for |x|<a, and $G(x) = \exp(-x^2)$. Thus, I'(x) is given by:

$$I'(x') = F\{I(x)\} = F\{\text{rect}(x/a) \cdot \exp(-x^2)\} = [a \cdot \text{sinc}(x \cdot a/2)] \star [(\pi)^{1/2} \exp\{-\pi^2 x'^2\}]$$

where the ⋆ symbol represents the convolution operation.

Figure 4A:
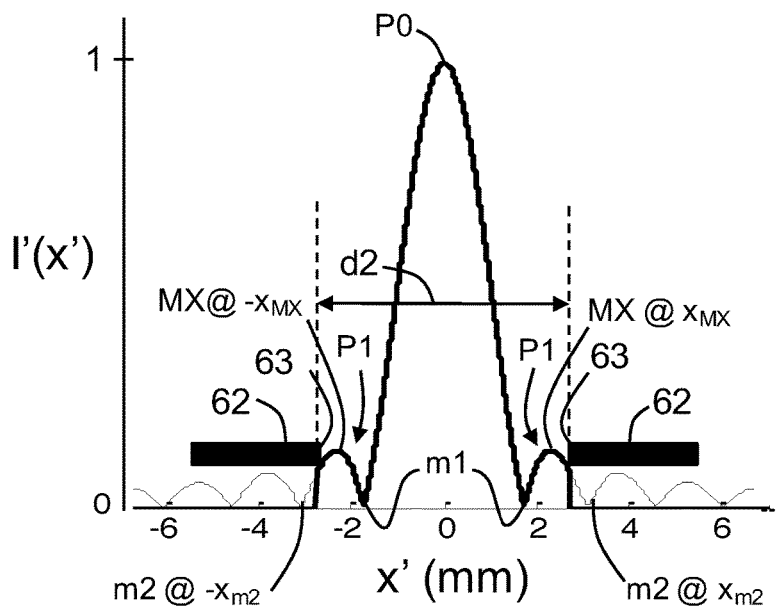
FIG. 4A is a plot of intensity profile I'(x') vs. x' (mm) of the first transmitted light at the Fourier plane at which is located a second aperture device, and shows an example position of the opposing blades of the second aperture device relative to the intensity profile.
Figure 4B:
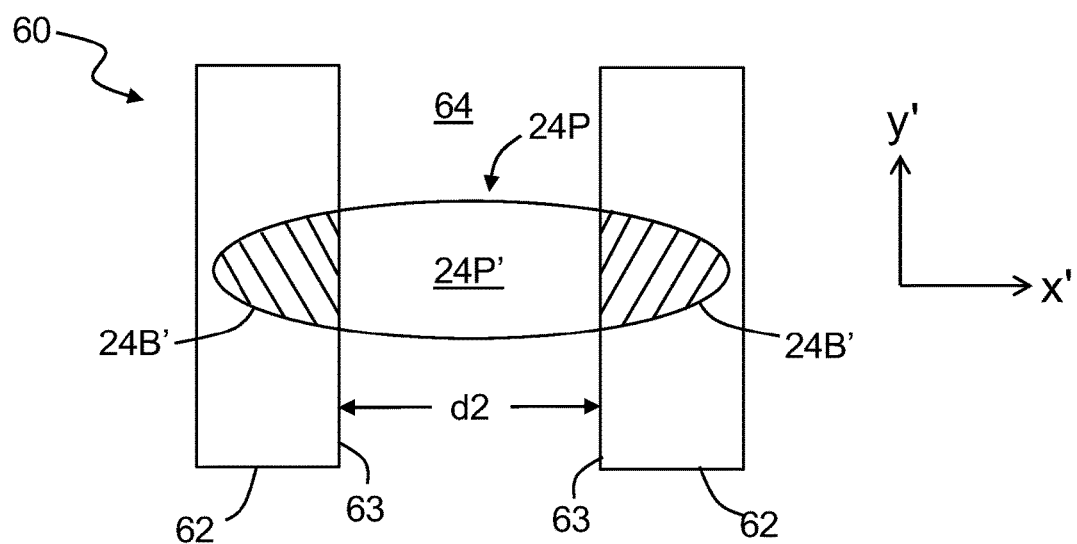
FIG. 4B is a front-on view of the second aperture device of FIG. 4A as looking in the +z direction in FIG. 2 and showing the first transmitted light incident thereon.

FIG. 4A is a plot of intensity distribution I'(x') vs. x' (mm) of the first transmitted light 24P at the second aperture device 60. FIG. 4B is a front-on view of the second aperture device 60 of FIG. 3B as looking in the +z direction. With reference to FIG. 4B, the blades 62 of second aperture device 60 are arranged so that a portion 24P' of first transmitted light 24P that is incident upon the second aperture device 60 passes through the slit aperture 64 of second aperture device 60 while respective portions 24B' of the first transmitted light 24P are block by the blades 62. The light 24P' is thus referred to as "second transmitted light" and is used by the downstream portion of relay optical system 50 to form the line image 80.

FIG. 4A shows details about where the blades 62 can be set to have a select width d2 to pass a select amount of the second transmitted light 24P'. The intensity profile I'(x) shows a strong central peak P0 surrounded by a number smaller peaks that diminish in size from the center of the profile. The first peaks on either side of the central peak P0 are denoted P1 and are defined by a maximum value MX surrounded by first and second minimum values (minima) m1 and m2. In an example, the slit aperture 64 is defined to have a width d2 wherein each blade edge 63 resides within the corresponding first peak P1 so that the slit aperture 64 transmits at least a portion of the first transmitted light 24P associated with the first peaks P1.

In another example, the second aperture device 60 is configured so that the edges 63 reside within the corresponding first peak P1 between the maximum value MX and the second minimum value m2. For example, if the x-values on the positive side of the x-axis are defined as $x_{MX}$ for the maximum value MX and $x_{m2}$ for the second minimum value m2, and the x-position of edge 63 is defined as $x_{63}$, then the condition for the location of edge 63 of the positive-side blade 62 can be expressed as $x_{MX} \leq x_{63} \leq x_{m2}$. The corresponding condition for the edge 63 on the negative side blade 62 can be expressed as: $-x_{m2} \leq -x_{63} \leq -x_{MX}$. It has been found that this spatial filtering condition provides the best results forming the line image 80 with an acceptable level of intensity non-uniformity, e.g., to within +/−5% as measured in the long direction over the length L.

In an example, the amount of first transmitted light 24P blocked by the second aperture device 60 at the Fourier plane IFP is about 5 to 8% so that about 95 to 92% of the first transmitted light 24P is transmitted to form the second transmitted light 24P'. This allows the relay optical system 50 to form the line image 80 at the image plane IP with an efficiency of up to about 75% relative to the input power or intensity provided to the object plane IP, as compared to the prior art efficiency of about 15%.

Furthermore, the intensity uniformity of line image 80 in the long direction (i.e., the x-direction) can satisfy in one example a tolerance of +/−5% in the long direction over the length L and in another example can satisfy a tolerance of +/−2%.

The line image 80 is formed at the image plane IP using second transmitted light 24P'. This second transmitted light 24P' in the x-direction is defined as a truncated version of I'(x') and can be denoted as follows, wherein F{·} stands for the Fourier transform operation:

$$I'(x') = F\{I(x)\} \cdot rect(x'/b) \text{ where } b =$$
$$(d2)/2. = [a \cdot sinc(x' \cdot a/2)] \bigstar [(\pi)^{1/2} exp\{-\pi^2 x'^2\}] \cdot rect(x'/b).$$

The intensity profile IL(x) of line image 80 is then the 1D inverse Fourier transform of I(x'), i.e., $$IL(x) = F^{-1}\{I'(x')\}.$$

From FIG. 4A, it can be seen that the second aperture device 60 defines the 1D "rect" function in the expression for I'(x') above and serves to remove select amounts of the higher spatial-frequency components along the x' axis. Because these higher spatial-frequency components are needed to form a high-definition line image that includes the intensity variations of the input (conditioned) laser beam 24 at the first aperture device 40, their filtering by the second aperture device 60 acts to smooth out the variation in intensity in the long direction of line image 80. On the other hand, because these higher spatial-frequency components have a relatively low intensity, most of the first transmitted light 24P makes it through the slit aperture 64 to form the second transmitted light 24P'.

Figure 5A:
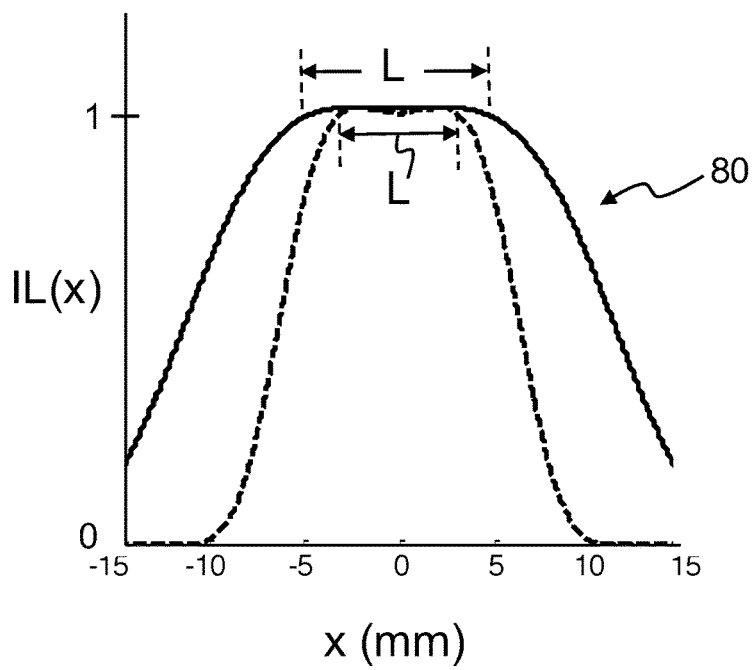
FIG. 5A is a plot of the intensity profile IL(x) vs. x (mm) at the final image plane at the substrate for the long direction of line image formed at the image plane by the second transmitted light and shows two different example sizes of lines of L=10 mm (solid line) and L=7.5 mm (dashed line) as formed by line-forming optical system of FIG. 2.

FIG. 5A is a plot of the intensity profile IL(x) vs. x (mm) for the long direction of line image 80 at the image plane IP and shows by way of example two different sizes of lines of L=10 mm (solid line) and L=7.5 mm (dashed line) as formed by the line-forming optical system 10. In an example, the length L of line image 80 can be in the range from 5 mm≤L≤100 mm.

Figure 5B:
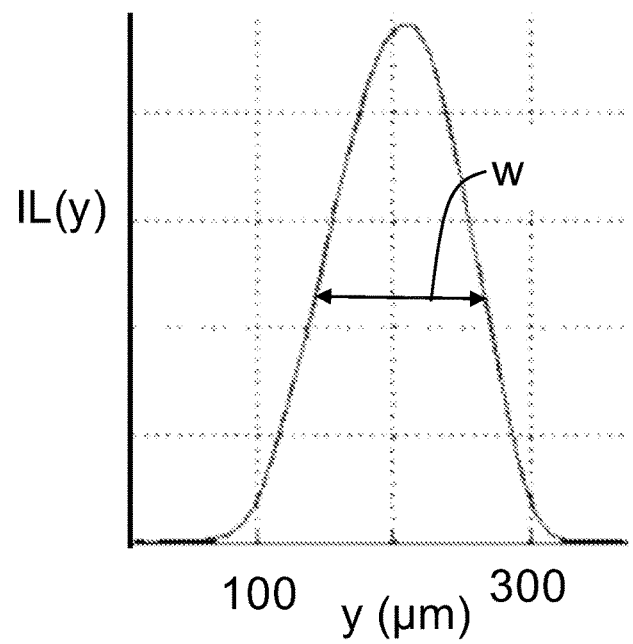
FIG. 5B is a plot of the intensity profile IL(y) vs. y (μm) of the line image and shows that the intensity profile IL(y) in the short direction (i.e., the y-direction) of the line image has a Gaussian shape that defines an example width w of about 75 μm.

FIG. 5B is a plot of the intensity profile IL(y) vs. y (μm) and shows that the intensity profile in the short direction (i.e., y-direction) of line image 80 has a Gaussian shape that defines an example width w of about 75 μm. In an example embodiment, the width w can be in the range 25 μm≤w≤1000 μm or 25 μm≤w≤500 μm or 25 μm≤w≤250 μm. As noted above, in an example, with the width w can be defined by the beam-conditioning optical system 30 so that the relay optical system 50 can be cylindrical with no optical power in the Y-Z plane.

Note that the intensity profile IL(y) in the short dimension for the line image 80 does not need to satisfy the same uniformity tolerance as the intensity profile IL(x) in the long dimension in the case where the line image 80 is scanned in the short direction, i.e., the y-direction. In such a case, the intensity variations in the y-direction average out during scanning. In the plot of intensity profile IL(y) of FIG. 5B, the line image 80 has a variation in intensity in the y-direction of about +/−10%.

Serrated Second Aperture Device

Figure 6A:
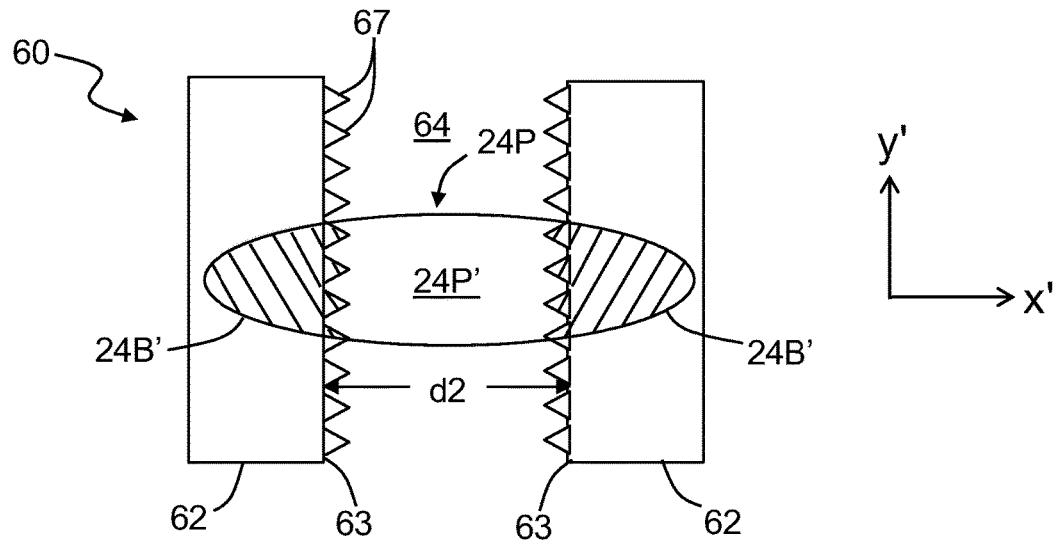
FIG. 6A is similar to FIG. 4B and illustrates an example of the second aperture device where the blade edges include serrations.
Figure 6B:
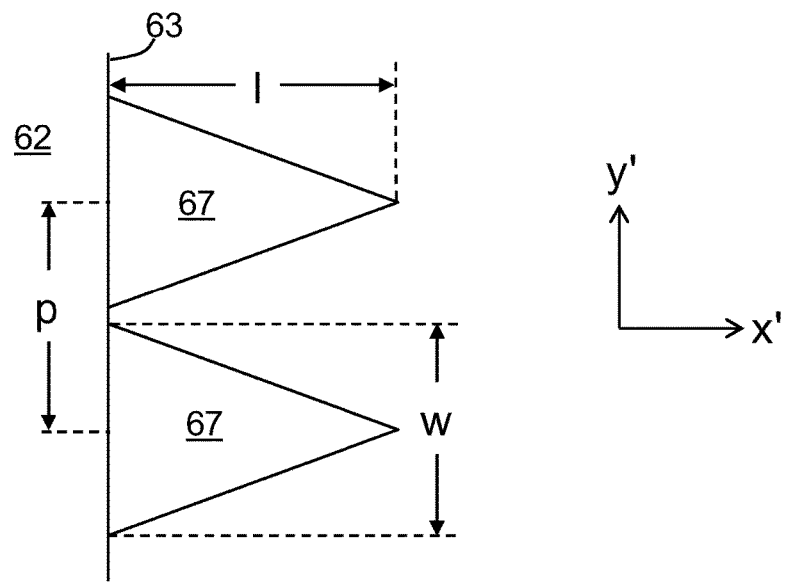
FIG. 6B is a close-up view of the left-side blade of the second aperture device of FIG. 6A showing two of the serrations and some of the dimensional parameters of the serrations.

FIG. 6A is similar to FIG. 4B and illustrates an example embodiment wherein the blades 62 of the second aperture device 60 includes serrations 67 at the edges 63. FIG. 6B is a close-up view of the left-side blade 62 and two of its serrations 67. In an example, the serrations 67 have a length l, a width w and a pitch p. In an example, the length l is in the range $$0.1 \cdot (\lambda/(d2)) \cdot f \leq l \leq (\lambda/(d2)) \cdot f$$

where f is the focal length of the first and second optical components 52A and 52B of reflective relay optical system 50. Also in an example, the pitch p of serrations 67 is substantially equal to the length l, e.g., (0.9)·l≤p≤(1.1)·l.

Figure 6C:
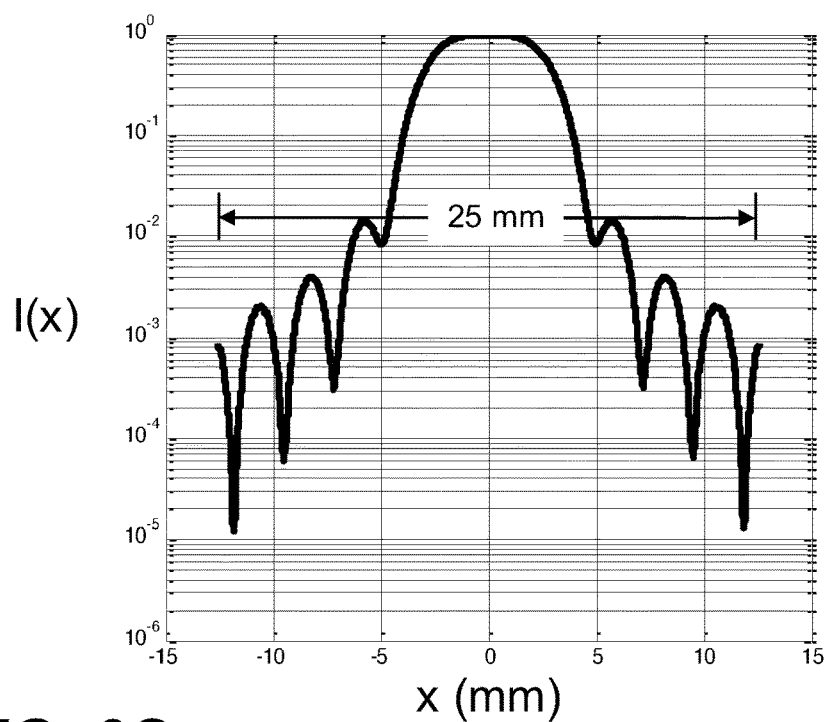
FIG. 6C is a logarithmic plot of the normalized intensity profile I(x) at the final image plane for an example of line-forming optical system where the blade edges are straight, i.e., have no serrations.
Figure 6D:
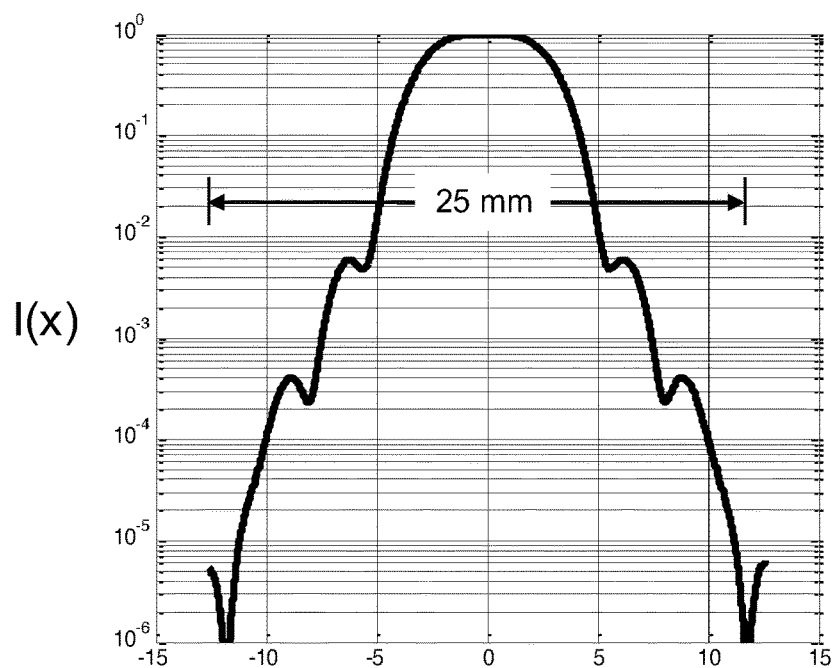
FIG. 6D is the corresponding plot to FIG. 6C but for the example where the blade edges include serrations.

The configuration of second aperture device 60 with the serrated blades 62 serves to reduce the intensity of light at the edges 63 of the downstream optical elements in the line-forming optical system 10. FIG. 6C is a logarithmic plot of the normalized intensity profile I(x) at the second optical component 52B of relay optical system 50 for an example of line-forming optical system 10 where the edges 63 are straight, i.e., no serrations 67. FIG. 6D is the corresponding plot for the example where the edges 63 include the serrations 67.

A comparison of the two plots of FIGS. 6D and 6C in relation to a downstream optical component having a diameter of 25 mm shows how the intensity at the edge of the downstream optical component is greatly reduced for the case where the edges 63 include the serrations. This results in weaker diffraction by the edges of the optical components, which reduces the amount of variation or ripples in the intensity profile I(x) of the line image 80 at the image plane IP.

Figure 1:
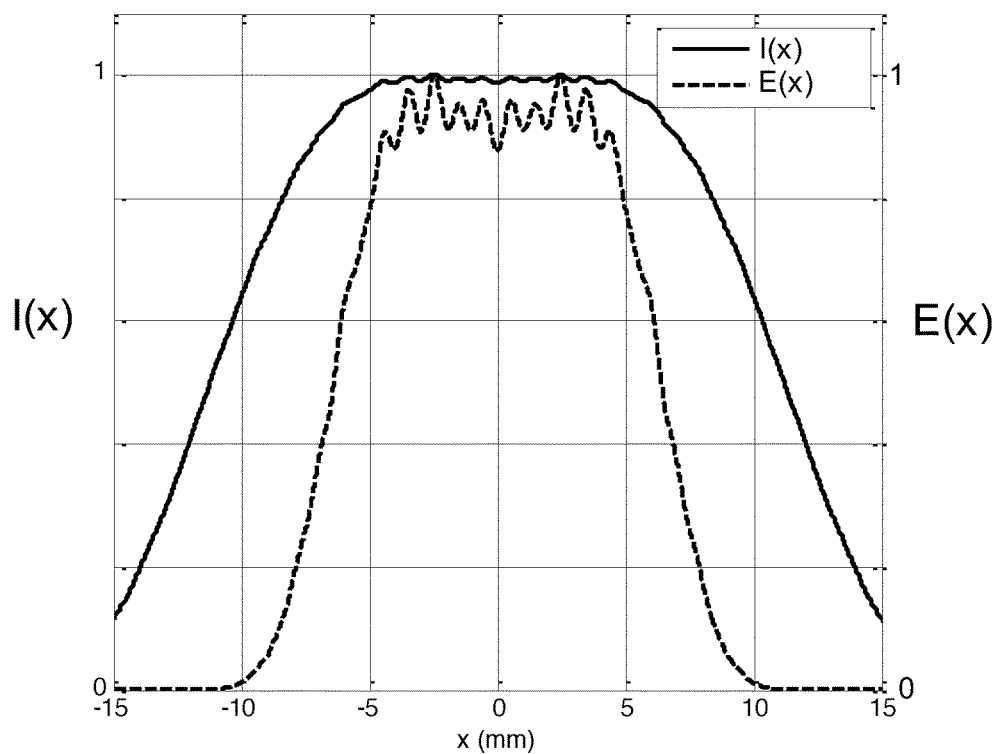
FIG. 1 is a plot of an intensity profile I(x) and a thermal emission profile E(x) (normalized units) versus distance x (mm) along the length of a line image formed by a prior-art line-forming optical system, illustrating how the intensity and thermal emission profiles have non-uniformities in the form of ripples, which can adversely impact the thermal processing of a semiconductor wafer.
Figure 6E:
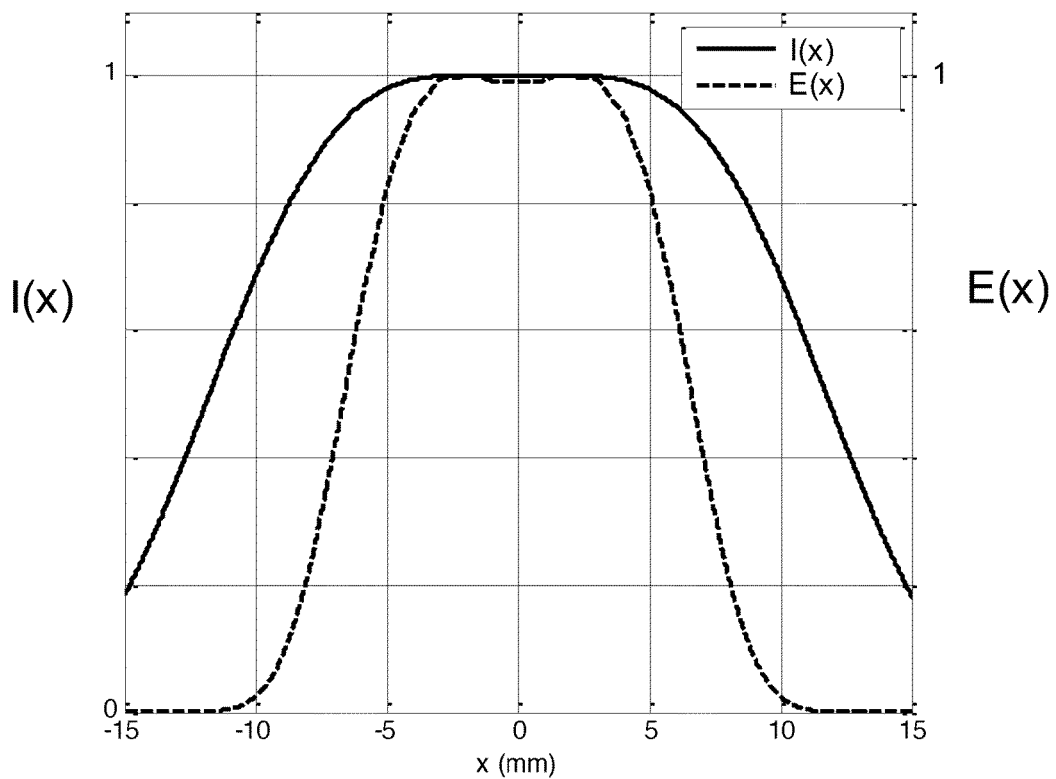
FIG. 6E is similar to FIG. 1 and shows the intensity profile I(x) at the final image plane and thermal emission profile E(x) for the case where the blade edges include serrations.

FIG. 6E is a plot similar to FIG. 1 of the intensity profile I(x) versus x (mm) at the image plane IP, and shows the drastic improvement in the uniformity of the intensity profile I(x) and in the thermal emission profile E(x), and in particular shows the ripples in the thermal emission profile E(x) being substantially eliminated.

Reflective Relay Optical System

Figure 7:
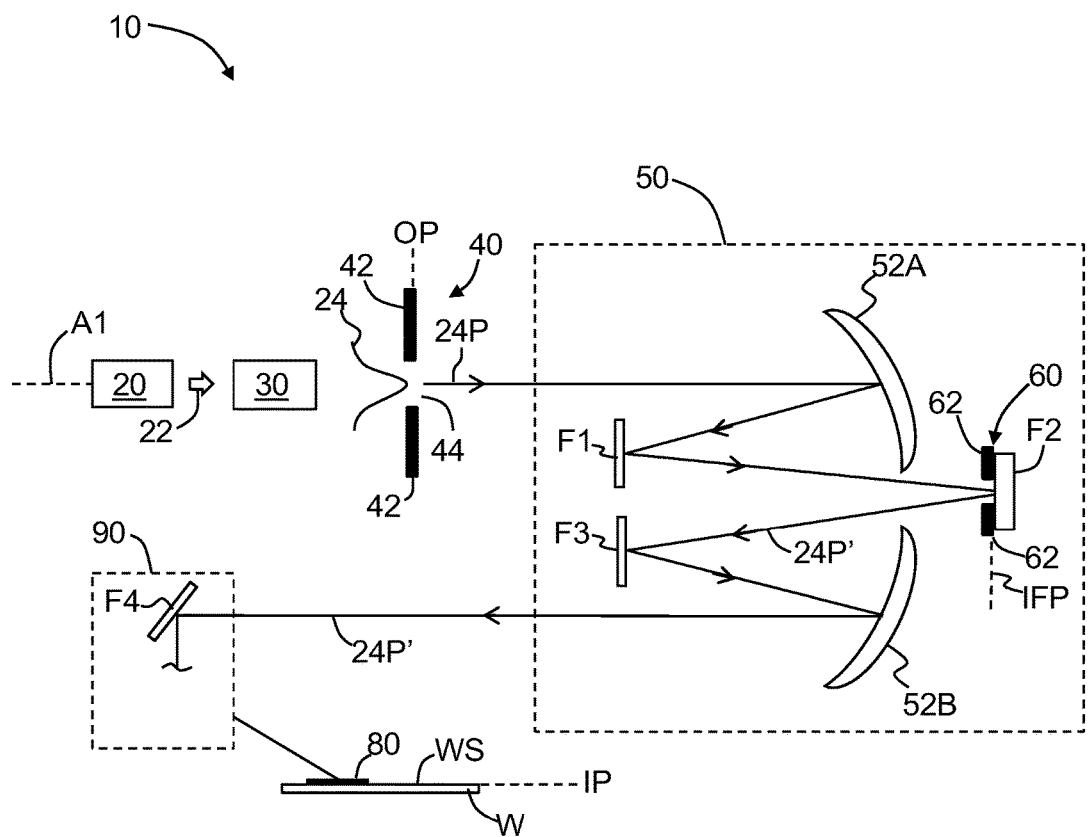
FIG. 7 is a schematic diagram of an example line-forming optical system that includes a reflective relay optical system.

FIG. 7 is a schematic diagram of an example line-forming optical system 10 that includes a reflective relay optical system 50 and a fold-mirror optical system 90 that is used to direct the line image 80 to a surface WS of a wafer W arranged in the image plane IP. The reflective relay optical system 50 includes first and second optical components 52A and 52B in the form of concave mirrors arranged in an off-axis configuration. The relay optical system 50 also includes fold mirrors F1, F2 and F3 that serve to fold the optical path of first transmitted light 24P that passes through the first aperture device 40 at the object plane OP. In this particular example, the fold mirror F2 is disposed at the Fourier plane IFP. The fold mirror F2 is arranged behind the second aperture device 60 so that the first transmitted light 24P incident upon the second aperture device 60, only the center portion (second transmitted light) 24P' is reflected by the fold mirror F2 to travel through the remainder of relay optical system 50. Thus, an example relay optical system 50 consists of reflective optical components, i.e., it has no refractive optical components. Such a configuration is desirable when the laser source 20 operates at an infrared wavelength, such as the $CO_2$ laser wavelength of nominally 10.6 μm.

This second transmitted light 24P' is reflected by the fold mirror F3 and directed to the second optical component 52B, which directs the second transmitted light 24P' to the fold-mirror optical system 90 that includes at least one fold mirror F4. In an example, the fold-mirror optical system 90 is configured to compensate for the object plane OP and image plane IP not being parallel so that the line image 80 is properly imaged onto the surface WS of wafer W.

Laser Annealing System

Figure 8:
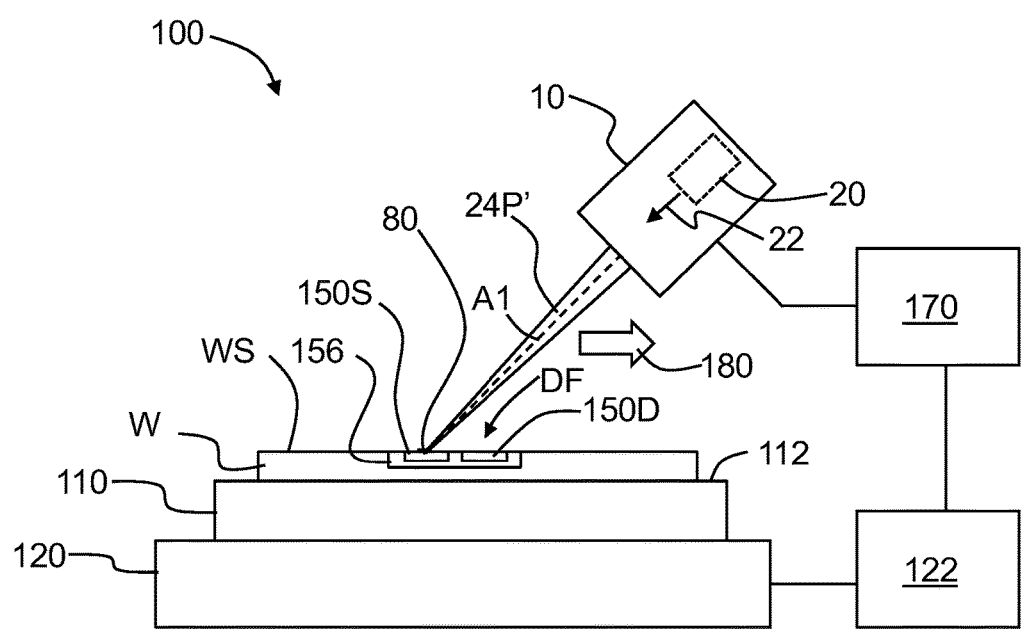
FIG. 8 is a schematic diagram of an example laser annealing system that includes the line-forming optical system of FIG. 2 as disclosed herein.

FIG. 8 is a schematic diagram of an example laser annealing system 100 that includes the line-forming optical system 10 disclosed herein. An example laser annealing system for which the line-forming optical system 10 is suitable for use is described in, for example, U.S. Pat. Nos. 7,612,372; 7,514,305; 7,494,942; 7,399,945; 7,154,066; 6,747,245; and 6,366,308.

The laser annealing system 100 of FIG. 8 includes, along the optical axis A1, the line-forming optical system 10 as described above, wherein the initial laser beam 22 emitted by the laser source 20 (see also FIG. 2) has a wavelength (e.g., nominally 10.6 microns from a $CO_2$ laser) that is absorbed by and is capable of heating the wafer W under select conditions. Such conditions include, for example, heating the wafer W, or irradiating the wafer W with a second radiation beam (not shown) having a bandgap energy greater than the semiconductor bandgap energy of the wafer W, thereby causing the wafer W to absorb the initial laser beam 22 to a degree sufficient to heat the wafer W to annealing temperatures $T_A$. An example of irradiating the wafer W with a second laser source to make the wafer W absorbent to the initial laser beam 22 is described in U.S. Pat. Nos. 7,098,155, 7,148,159 and 7,482,254.

The wafer W is supported by a chuck 110 having an upper surface 112. In an example, the chuck 110 is configured to heat the wafer W. The chuck 110 in turn is supported by a stage 120 that in turn can be supported by a platen (not shown). In an example embodiment, the chuck 110 is incorporated into the stage 120. In another example embodiment, the stage 120 is movable, including being translatable and rotatable. In an example, the chuck 110 is used to pre-heat the wafer W, e.g., up to a few hundred degrees or so.

The wafer W is shown by way of example as having device features DF in the form of source and drain regions 150S and 150D formed at or near the surface WS of wafer W as part of a circuit (e.g., transistor) 156 formed in the wafer W. Note that the relative sizes of the source and drain regions 150S and 150D in the circuit 156 compared to the wafer W are greatly exaggerated for ease of illustration. In practice, the source and drain regions 150S and 150D are very shallow, having a depth into the wafer W of about one micron or less. In an example, the surface WS of wafer W includes patterns defines by device structures formed in the wafer W as part of the device manufacturing process. The patterns give rise to the aforementioned adverse pattern effects that can result in temperature non-uniformities when the wavelength λ of light irradiating the surface WS of wafer W is less than about 50 times the size δ of the patterns.

In an example embodiment, the laser annealing system 100 further includes a controller 170 electrically connected to the line-forming optical system 10 and to a stage controller 122. The stage controller 122 is electrically coupled to the stage 120 and is configured to control the movement of the stage 120 via instructions from the controller 170. The controller 170 is configured coupled to control the operation of laser annealing system 100 generally, and in particular the laser source 20 and stage controller 122.

In an example embodiment, the controller 170 is or includes a computer, such as a personal computer or workstation, available from any one of a number of well-known computer companies such as Dell Computer, Inc., of Austin, Tex. The controller 170 preferably includes any of a number of commercially available micro-processors, a suitable bus architecture to connect the processor to a memory device, such as a hard disk drive, and suitable input and output devices (e.g., a keyboard and a display, respectively).

With continuing reference to FIG. 8, the second transmitted light 24P' generated as described above is directed onto the surface WS of wafer W to form the line image 80 thereon. It is noted that the term "image" is used herein in to generally denote the distribution of light formed by the second transmitted light 24P' at the image plane IP and the surface WS of wafer W residing therein.

In an example embodiment, the line image 80 is scanned over the surface WS of wafer W, as indicated by the arrow 180 in FIG. 8, resulting in localized rapid heating of the surface WS of wafer W (down to a depth of about 100 microns or less) up to an annealing temperature $T_A$ (e.g., between 1000° C. and 1,300° C. for a non-melt process and in excess of the melt temperature of silicon of about 1,400° C. for a melt process) sufficient to activate dopants in the source and drain regions 150S and 150D, while also allowing for rapid cooling of the surface WS of wafer W so that the dopants do not substantially diffuse, thereby maintaining the shallowness of the source and drain regions 150S and 150D. Blanket dopant activation of surface WS of wafer W can also be performed using the laser annealing system 100. A typical scan velocity of the line image 80 over the surface WS of wafer W ranges from 25 mm/sec to 1000 mm/sec. In an example, one or both of the second light beam 24P' and the wafer W can move during scanning.

Because the line-forming optical system 10 can form a relatively long line image 80 having a relatively large power density, the wafer W can be scanned much faster (e.g., up to 3× faster or have 3× longer process line for 3× throughput improvement) than previous line-forming optical systems would allow, thereby increasing the number of wafer W per hour that can be processed by the laser annealing system 100.

Defect and Spike Annealing Systems and Methods

Aspects of the disclosure include systems and methods for performing defect annealing, or defect annealing and spike annealing using the line-forming optical system 10 disclosed herein. FIG. 9 is similar to FIG. 8 and discloses another embodiment of laser annealing system 100 that includes the $CO_2$-laser-based line-forming optical system 10 as disclosed herein to perform defect annealing and also includes a diode-based line-forming optical system 200 used to perform the spike annealing. The diode-based line-forming optical system 200 is operably connected to the controller 170 and includes a laser diode light source 220 that emits a light beam 222 of wavelength $\lambda_2$. The diode-based line-forming optical system 200 also includes line-forming optics 223 arranged to receive the light beam 222 and form a light beam 224 that forms a line image 280 at the surface WS of wafer W. In an example, the wavelength $\lambda_2$ is in the visible and near-infrared range, e.g., 380 nm≤$\lambda_2$≤1000 nm, while in another example is in the visible range only, e.g., 500 nm≤$\lambda_2$≤900 nm. The line-forming optics 223 can include one or more optical elements, which can be refractive, reflective, diffractive, etc. In an example, the line-forming optics 223 is anamorphic, and further in an example is or includes a cylindrical optical system. In an example, the line image 280 has an intensity uniformity within +/−5% over its length.

In an example, the line image 280 overlaps with the line image 80, as illustrated in FIG. 9 and as shown in the close-up view of FIG. 10A. In another example, the line image 280 fits within the line image 80, as shown in FIG. 10B. In another example, most of the line image 280 fits within the line image 80 formed by the $CO_2$-laser-based line-forming optical system 10 while some of the line image 280 falls outside of the line image 80, as shown in FIG. 10C. In an example, the line image 280 is substantially narrower than the line image 80, and further in an example has a width in the range from 25 microns to 250 microns, or in the range from 50 microns to 150 microns. In an example, the width of line image 280 is between 5% and 25% of the width of line image 80. In an example, the line image 80 and the line image 280 have about the same length, which in one example is in the range from 5 mm to 100 mm. In an example, the width of line image 80 is about 1 mm and the width of line image 280 is in the range of 50 microns and 150 microns. In an example, the line images 80 and 280 at least partially overlap.

In an example, the second transmitted light 24P' delivers between 1000 W and 3000 W of optical power to the surface WS of wafer W via the line image 80. As noted above, the line image 80 can have a width of up to about 1 mm. In the example of FIG. 8, the second transmitted light 24P' and the line image 80 are used to perform defect annealing by scanning the line image 80 over the surface WS of wafer W to locally raise the temperature of the surface WS of wafer W to a defect anneal temperature $T_D$, which in an example is 1050° C. In practice, the defect anneal temperature $T_D$ is related to the duration of the anneal, i.e., the dwell time of line image 80. Typically, longer defect annealing times require lower temperatures. In an example, the defect annealing times $t_D$ can range from 2 milliseconds to 15 milliseconds, with the corresponding defect anneal temperatures $T_D$ ranging in one example from about 1000° C. to 1150° C. for $t_D$=2 milliseconds, and in another example ranging from 700° C. to 1000° C. for $t_D$=15 milliseconds. In an example, the anneal temperature $T_D$ is in the range 650° C.$\leq T_D \leq$1100° C.

The light 224 and line image 280 from diode-based line-forming optical system 200 is used to perform spike annealing of wafer W. In an example, the laser diode light source 220 generates a relatively small amount of optical power, e.g., 300 to 500 W. There are two main reasons why so little diode laser power is needed. The first reason is that the temperature jump from the defect anneal temperature $T_D$ to the spike anneal temperature $T_A$ is small, e.g., a few hundred degrees centigrade. The second reason is that the absorption length of the diode laser visible wavelength $\lambda_2$ as compared to the $CO_2$ laser infrared wavelength $\lambda_1$ is typically 100× shorter. Hence, a laser with a substantially smaller optical power output can be used for the laser spike annealing as compared to the conventional approach where the $CO_2$ laser is used to perform laser spike annealing. Because much less diode laser power is being used than in the conventional approach, there is much less risk to damaging the edge of the wafer W.

In the conventional approach, 2 to 3 kW of diode laser power needs to be delivered by the light 224 and line image 280. With the laser annealing system and methods disclosed herein, roughly 200 to 500 watts of diode laser power can be employed, depending on the required amount of heat needed to raise the temperature from the defect anneal temperature $T_D$ to the spike anneal (or dopant activation) temperature $T_A$ and the size and scanning speed of line image 280.

In an example, the line image 280 has a width in the scan direction of between 50 and 150 microns. In an example, the diode-based line-forming optical system 200 is optical-fiber based, as described for example, in the aforementioned U.S. patent application Ser. No. 14/497,006.

The diode-based line-forming optical system 200 is arranged such that the line image 280 at least partially overlaps with the line image 80, as described below. The optical power provided by the light 224 and line image 280 is used to locally raise the temperature of the surface WS of wafer W from the defect anneal temperature $T_D$ (e.g., of about 1050° C.) to a spike anneal (or dopant activation) temperature $T_A$, which in an example is approximately 1150° C. to 1350° C.

Because this temperature rise of a few hundred degrees or so is performed using the light 224 at wavelength $\lambda_2$, there is up to about a 20% pattern temperature non-uniformity (e.g., up to about 60° C.) due to pattern effects. This amount of non-uniformity is a substantial improvement over the prior art for which the temperature non-uniformity from pattern effects can be as large as 160° C. Thus, the laser annealing system 100 and methods of annealing using this laser annealing system 100 can improve temperature uniformity during spike annealing. In an example, this improvement can be about 25% or more, e.g., between about 25% and 40%. Typical dwell times for the spike annealing using the line image 280 can range from between 200 microseconds and 800 microseconds. The width of line image 280 determines the scanning speed (e.g., the stage velocity).

As noted above, an added benefit of using a visible wavelength $\lambda_2$ for carrying out the spike annealing is that the light 224, which in an example irradiates the side of wafer W during scanning, has relatively low power, which significantly reduces the probability of damage to the wafer W and in particular reduces the chances of wafer breakage.

It will be apparent to those skilled in the art that various modifications to the preferred embodiments of the disclosure as described herein can be made without departing from the spirit or scope of the disclosure as defined in the appended claims. Thus, the disclosure covers the modifications and variations provided they come within the scope of the appended claims and the equivalents thereto.

What is claimed is:

1. A system for performing defect annealing of a semiconductor wafer having a surface with a pattern, comprising:
   a $CO_2$ laser source that emits an initial light beam having a wavelength $\lambda$ of 10.6 microns;
   a beam-conditioning optical system that receives the initial light beam and forms therefrom a conditioned light beam having a first intensity profile with a Gaussian distribution in at least a first direction;
   a first aperture device operably disposed at an object plane and that defines a first slit aperture that truncates the first intensity profile in the first direction to define first transmitted light that constitutes at least 50% of the conditioned light beam;
   a relay optical system that defines the object plane and that also defines an intermediate Fourier plane at which is operably disposed a second aperture device, the relay optical system defining at the Fourier plane a second intensity profile having a central peak and first side peaks immediately adjacent the central peak, wherein the second aperture device is configured with serrated blades that truncate the second intensity profile in the first direction and within each of the first side peaks to define second transmitted light;
   wherein the relay optical system forms from the second transmitted light a first line image at the wafer surface, wherein the first line image includes between 1000 W and 3000 W of optical power, has a first length in the range from 5 mm to 100 mm, and has an intensity uniformity of within +/−5%;
   a chuck that operably supports the wafer; and
   a moveable wafer stage that operably supports the chuck and that is configured to move the chuck and the wafer supported thereon so that the first line image scans over the wafer surface to locally raise a temperature of the wafer surface to a defect anneal temperature $T_D$.

2. The system according to claim 1, wherein the relay optical system has a first optical component with a focal length f that defines the Fourier plane, wherein the blades of the second aperture device are separated by a width d2, and wherein the serrated blades each includes serrations having a length l in the range $0.1 \cdot (\lambda/(d2)) \cdot f \leq l \leq (\lambda/(d2)) \cdot f$.

3. The system according to claim 2, wherein the serrations have a pitch p within the range $(0.9) \cdot l \leq p \leq (1.1) \cdot l$.

4. The system according to claim 1, wherein the defect anneal temperature $T_D$ is in the range from 650° C. to 1100° C.

5. The system according to claim 1, wherein the chuck is heated so that it can pre-heat the wafer.

6. The system according to claim 1, further including a diode-based line-forming optical system that generates a visible light beam that forms at the wafer surface a second line image that at least partially overlaps and scans with the first line image to locally raise the temperature of the wafer surface from the defect annealing temperature $T_D$ to a spike anneal temperature $T_A$, and wherein the second line image has an intensity variation of within +/−5%.

7. The system according to claim 6, wherein the spike anneal temperature is in the range from 1150° C. to 1350° C.

8. The system according to claim 6, wherein the first and second line images have respective first and second widths, and wherein the second width is in the range from 5% to 25% of the first width.

9. The system of claim 6, wherein the diode-based line-forming optical system includes a laser diode light source and line-forming optics arranged relative thereto.

10. The system according to claim 1, wherein each side peak is defined by a maximum value MX and first and second minimum values m1 and m2, and wherein the second aperture device is configured to truncate the second intensity profile between the maximum value MX and the second minimum value m2 in each first side peak.

11. The system according to claim 1, wherein the relay optical system has substantially 1× magnification in the first direction.

12. The system according to claim 11, wherein the relay optical system is a cylindrical optical system having optical power only in the first direction.

13. The system according to claim 1, wherein the optical relay system consists of reflective optical components only.

14. The system according to claim 1, wherein the first aperture device comprises a pair of blades operably disposed in the object plane.

15. The system of claim 1, wherein the second aperture device comprises a pair of blades operably disposed in the intermediate Fourier plane.

16. A line-forming optical system for forming a line image at an image plane, comprising:
a laser source that emits an initial light beam having a wavelength $\lambda$;
a beam-conditioning optical system that receives the initial light beam and forms therefrom a conditioned light beam having a first intensity profile with a Gaussian distribution in at least a first direction;
a slit aperture that truncates the first intensity profile in the first direction to define first transmitted light that constitutes at least 50% of the conditioned light beam;
a relay optical system that includes first and second optical components and that defines an object plane, an image plane and a Fourier plane between the object and image planes, wherein the first optical component has a focal length f and forms at the Fourier plane a second intensity profile having a central peak and first side peaks immediately adjacent the central peak;
opposing serrated blades arranged at the Fourier plane and configured to truncate the second intensity profile in the first direction and within each of the first side peaks to define second transmitted light; and
wherein the second optical component forms from the second transmitted light the line image at the image plane.

17. The line-forming optical system according to claim 16, wherein the laser source includes a $CO_2$ laser and wherein the initial light beam has a wavelength of 10.6 microns.

18. The line-forming optical system according to claim 16, wherein the opposing serrated blades are separated by a width d2, and wherein the serrated blades each includes serrations having a length l in the range $0.1 \cdot (\lambda/(d2)) \cdot f \leq l \leq (\lambda/(d2)) \cdot f$.

19. The line-forming optical system according to claim 18, wherein the serrations have a pitch p within the range $(0.9) \cdot l \leq p \leq (1.1) \cdot l$.

20. The line-forming optical system according to claim 16, wherein the line image has between 1000 W and 3000 W of optical power, has a length in the range from 5 mm to 100 mm, and has an intensity uniformity of within +/−5%.

* * * * *